United States Patent
Nagata

(10) Patent No.: US 10,712,383 B2
(45) Date of Patent: Jul. 14, 2020

(54) INSPECTION JIG

(71) Applicant: YOKOWO CO., LTD., Kita-ku, Tokyo (JP)

(72) Inventor: Takahiro Nagata, Tomioka (JP)

(73) Assignee: YOKOWO CO., LTD., Kita-ku, Tokyo (JP)

(*) Notice: Subject to any disclaimer, the term of this patent is extended or adjusted under 35 U.S.C. 154(b) by 0 days.

(21) Appl. No.: 16/202,304

(22) Filed: Nov. 28, 2018

(65) Prior Publication Data

US 2019/0187205 A1    Jun. 20, 2019

(30) Foreign Application Priority Data

Dec. 18, 2017  (JP) ................ 2017-241392

(51) Int. Cl.
| | | |
|---|---|---|
| G01R 1/04 | (2006.01) | |
| G01R 1/067 | (2006.01) | |
| G01R 31/02 | (2006.01) | |
| G01R 31/28 | (2006.01) | |
| H01R 12/00 | (2006.01) | |
| H01R 4/48 | (2006.01) | |
| G01R 1/073 | (2006.01) | |

(52) U.S. Cl.
CPC ..... *G01R 31/2886* (2013.01); *G01R 1/07342* (2013.01)

(58) Field of Classification Search
CPC .......... G01R 1/04; G01R 1/067; G01R 1/073; G01R 31/02; G01R 31/28; H01R 12/00; H01R 4/48
See application file for complete search history.

(56) References Cited

U.S. PATENT DOCUMENTS

| | | | | |
|---|---|---|---|---|
| 4,906,920 A | * | 3/1990 | Huff ............... | G01R 1/0735 324/73.1 |
| 5,563,521 A | * | 10/1996 | Crumly ............ | G01R 1/0735 324/754.11 |
| 5,825,192 A | * | 10/1998 | Hagihara ........ | G01R 31/2887 324/756.03 |
| 2017/0074902 A1 | | 3/2017 | Nagata | |

FOREIGN PATENT DOCUMENTS

JP    2017-058201 A    3/2017

\* cited by examiner

*Primary Examiner* — Neel D Shah

(74) *Attorney, Agent, or Firm* — Morgan, Lewis & Bockius LLP

(57) ABSTRACT

An inspection jig includes a rigid substrate, a flexible substrate connected to the rigid substrate, a support supporting a part of the flexible substrate in a state that the part of the flexible substrate is protruded with respect to the rigid substrate in a first direction, a biasing unit configured to bias the support in the first direction with respect to the rigid substrate, and a contactor provided on a protruding portion of the flexible substrate, the protruding portion being protruded with respect to the rigid substrate. The contactor includes a contact housing, and a probe supported on the contact housing. One end of the probe is in contact with a contact portion on the protruding portion.

18 Claims, 2 Drawing Sheets

COMPARATIVE EXAMPLE

INSPECTION JIG

CROSS REFERENCE TO RELATED APPLICATIONS

This application is based on Japanese Patent Application (No. 2017-241392) filed on Dec. 18, 2017, the contents of which are incorporated herein by way of reference.

BACKGROUND

The present invention relates to an inspection jig such as a probe card used for inspecting electrical characteristics of a semiconductor integrated circuit and the like.

In general, an inspection jig such as a probe card used for inspecting electrical characteristics of a semiconductor integrated circuit includes a rigid substrate and a flexible substrate connected to the rigid substrate. The flexible substrate includes contact portions that contact an electrode of an inspection object (for example, a wafer). The flexible substrate includes, on a back side of the contact portion, a block that presses the flexible substrate on the inspection object. The block is biased toward the inspection object by a biasing unit such as a spring and applies a contact force to the flexible substrate between the flexible substrate and the inspection object.

Patent Document 1: JP-A-2017-58201

SUMMARY

The present invention provides an inspection jig capable of suppressing breakdown of contact portions of a flexible substrate.

An embodiment of the present invention provides an inspection jig. The inspection jig includes:

a rigid substrate;

a flexible substrate connected to the rigid substrate;

a support supporting a part of the flexible substrate in a state that the part of the flexible substrate is protruded with respect to the rigid substrate in a first direction;

a biasing unit configured to bias the support in the first direction with respect to the rigid substrate; and a contactor provided on a protruding portion of the flexible substrate, the protruding portion being protruded with respect to the rigid substrate, wherein the contactor includes:

a contact housing; and a probe supported on the contact housing, one end of the probe being in contact with a contact portion on the protruding portion.

The probe may be provided in the contact housing in an individually replaceable state.

The contact housing may be fixed to the support in a detachable manner.

DETAILED DESCRIPTION OF EXEMPLIFIED EMBODIMENT

Figure 1:
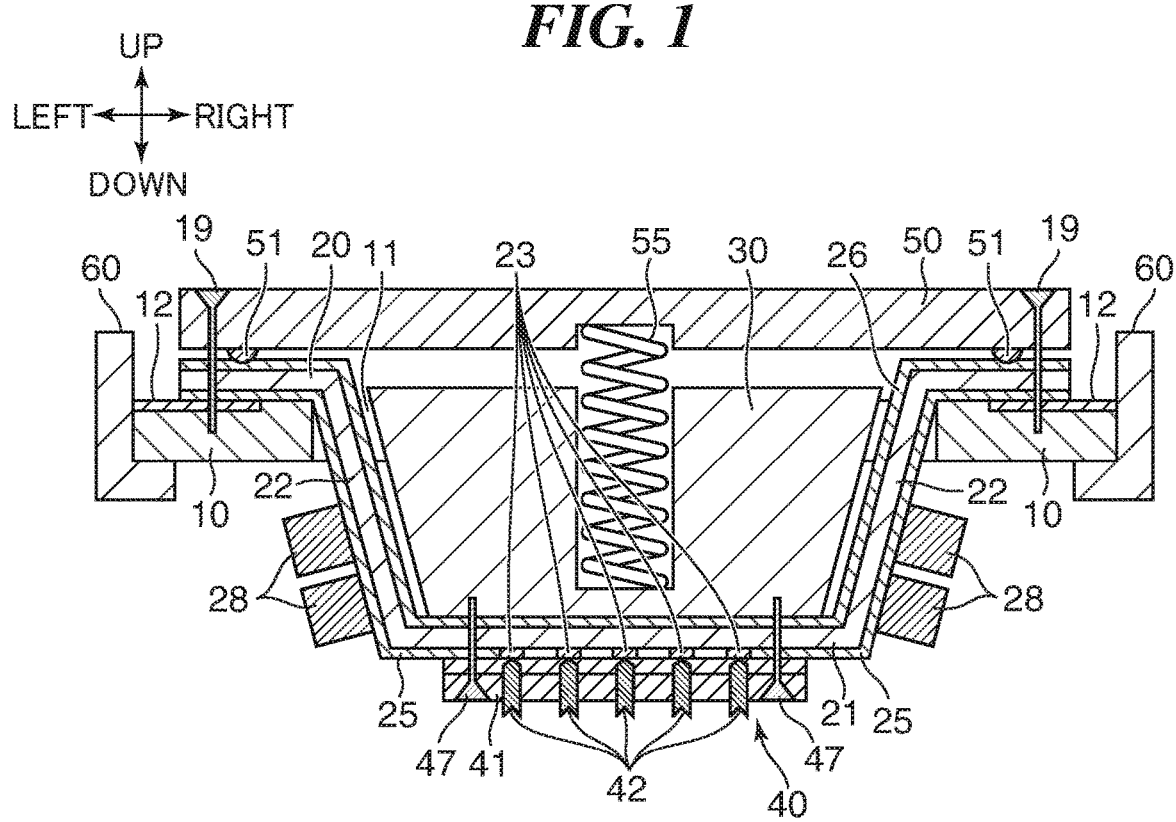
FIG. 1 is a schematic sectional view of an inspection jig 1 according to an embodiment of the present invention.

An entire flexible substrate has to be replaced even when one contact portion thereof is broken down, resulting in an enormous amount of time and costs for replacement.

The present invention provides an inspection jig capable of suppressing breakdown of contact portions of a flexible substrate.

Hereinafter, a preferred embodiment of the present invention is described in detail with reference to the drawings. The same or equivalent components, members, and the like illustrated in the drawings are denoted by the same reference numerals, and descriptions of these components are not repeated. The embodiment is not intended to limit the present invention. All features and combinations of these features described in the embodiment are not necessarily essential to the present invention.

Figure 2:
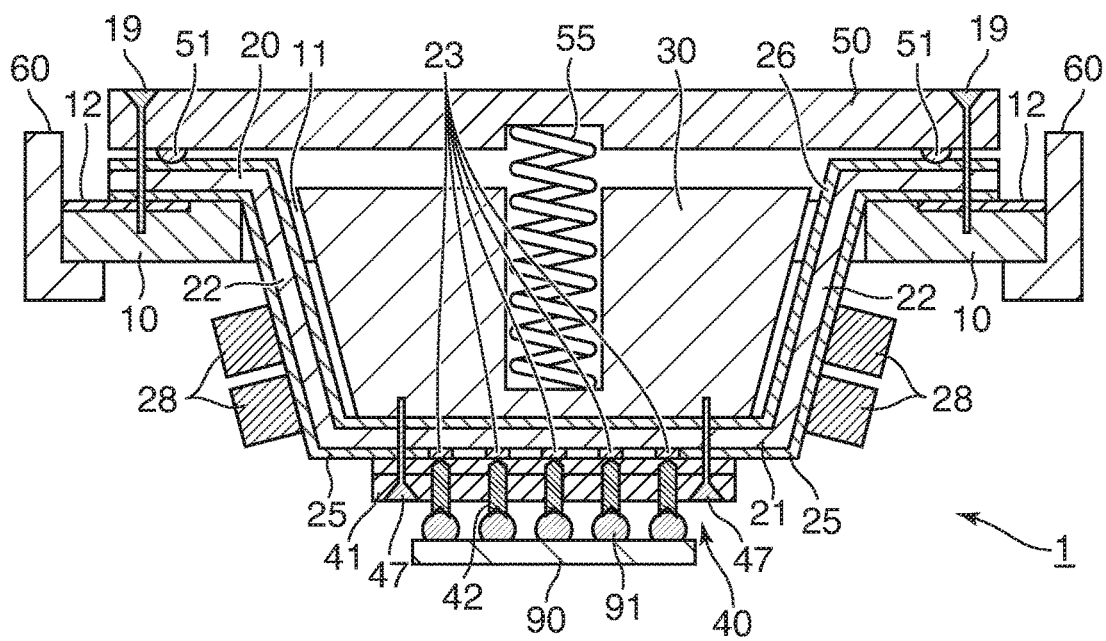
FIG. 2 is a schematic sectional view in which a contactor 40 of the inspection jig 1 is in contact with bumps 91 on a to-be-measured wafer 90.

FIG. 1 is a schematic sectional view of an inspection jig 1 according to an embodiment of the present invention. FIG. 2 is a schematic sectional view in which a contactor 40 of the inspection jig 1 is in contact with bumps 91 on a to-be-measured wafer 90. The upper-lower direction and the left-right direction orthogonal to each other in the inspection jig 1 are defined in FIG. 1. In FIG. 1, the vertical direction of the sheet refers to the upper-lower direction and the horizontal direction thereof refers to the left-right direction. The direction perpendicular to the upper-lower direction and the left-right direction is defined as the front-rear direction. The inspection jig 1 is, for example, a probe card, and is used to inspect electrical characteristics of a semiconductor integrated circuit in a wafer state. The inspection jig 1 includes a rigid substrate 10, a flexible substrate 20, a pedestal block 30 performing as a support, a contactor 40, a crimping block 50, and an attachment mechanism 60.

The rigid substrate 10 is made of a material that is less deformable than the flexible substrate to be described below. For example, the rigid substrate 10 is a glass epoxy substrate. The rigid substrate 10 extends orthogonal to the upper-lower direction. A through hole 11 penetrates the rigid substrate 10 in the upper-lower direction. The rigid substrate 10 includes, on an upper surface thereof, a high frequency line (high frequency conductive pattern) 12 for transmitting a high frequency signal. Although not illustrated, the rigid substrate 10 includes a low frequency line (low frequency conductive pattern) that transmits a low frequency signal, a power supply line (power supply conductive pattern), and a ground line (ground conductive pattern).

The flexible substrate 20 is made of a deformable material. Both left and right end portions of the flexible substrate 20 are connected to the upper surface of the rigid substrate 10 by a pressing force of the crimping block 50. The flexible substrate 20 extends below the rigid substrate 10 through the through hole 11. The flexible substrate 20 is protruded downward with respect to the rigid substrate 10 by support of the pedestal block 30. The flexible substrate 20 includes a protruding portion 21 that protrudes downward with respect to the rigid substrate 10. A lower surface of the protruding portion 21 is a flat surface. The lower surface of the protruding portion 21 is provided with a plurality of contact pads 23 performing as contact portions. The contact pads 23 include contact pads for a high frequency signal, a low frequency signal, a power supply, and ground.

The flexible substrate 20 includes a high frequency line (high frequency conductive pattern) 25 on a lower surface of the flexible substrate 20. One end of the high frequency line 25 is connected to a contact pad 23 for a high frequency and the other end of the high frequency line 25 is connected to the high frequency line 12 of the rigid substrate 10. The flexible substrate 20 includes a ground line (ground conductive pattern) 26 on an upper surface of the flexible substrate 20. The ground line 26 connects the ground line of the rigid substrate 10 and a contact pad 23 for ground to each other. Electrical connection between the upper surface and the lower surface of the flexible substrate 20 is performed via a through hole (not illustrated) when necessary. Although not illustrated, the flexible substrate 20 includes a low frequency line (low frequency conductive pattern) that connects the low frequency line of the rigid substrate 10 and a contact pad 23 for the low frequency signal, and a power supply line (power supply conductive pattern) that connects the power supply line of the rigid substrate 10 and a contact pad 23 for the power supply. The flexible substrate 20 includes an inclined portion 22 between the left and right end portions of the flexible substrate 20 and the protruding portion 21. A matching circuit mounted on the high frequency line 25 and an electronic component 28 (for example, a chip capacitor) connected between the power supply line and the ground line may be provided on the inclined portion 22 as necessary. The electronic component 28 is located above the contactor 40.

The pedestal block 30 is, for example, an insulating resin molded body. The pedestal block 30 extends through the through hole 11 of the rigid substrate 10 and further extends from the though hole 11 upward and downward. The pedestal block 30 is biased downward with respect to the crimping block 50 by a spring 55. The pedestal block 30 has a substantially trapezoidal cross section perpendicular to the front-rear direction. The pedestal block 30 supports a part of the flexible substrate 20 in a state that the part of the flexible substrate 20 is protruded downward with respect to the rigid substrate 10. A lower surface of the pedestal block 30 is a flat surface. An upper surface of the protruding portion 21 of the flexible substrate 20 is a flat surface. The upper surface of the protruding portion 21 may be in contract with the lower surface of the pedestal block 30.

The contactor 40 includes a contact housing 41 and a plurality of probes (pins) 42. The contactor 40 is separated from the flexible substrate 20 and is detachable from the flexible substrate 20. The contact housing 41 is, for example, an insulating resin molded body. The contact housing 41 supports the probes 42. The contact housing 41 is fixed to the pedestal block 30 by a predetermined number of screws 47 in a detachable manner. Each of the probes 42 is a conductive metal such as copper or a copper alloy that extends in the upper-lower direction. The probes 42 have no stretchability. Upper ends of the probes 42 are in contact with the contact pads 23 disposed on the lower surface of the protruding portion 21 of the flexible substrate 20. The upper ends of probes 42 may also be in contact with the contact pad 23 elastically. As illustrated in FIG. 2, lower ends of the probes 42 contact the bumps 91 provided on the to-be-measured wafer 90. The lower ends of the probes 42 may also contact the bumps 91 elastically. The probes 42 are preferably replaceable individually with respect to the contact housing 41.

The crimping blocks 50 are fixed to the upper surface of the rigid substrate 10 by a predetermined number of screws 19, so as to sandwich the left and right end portions of the flexible substrate 20 between the crimping blocks 50 and the upper surface of the rigid substrate 10. The crimping blocks 50 include elastic bodies 51 such as rubber on lower surfaces (surfaces on the rigid substrate 10 side) of the crimping blocks 50. The elastic bodies 51 press both the left and right end portions of the flexible substrate 20 on the upper surface of the rigid substrate 10 in an elastic manner. In this way, the high frequency line 12 on the upper surface of the rigid substrate 10 and t high frequency line 25 on the lower surface of the flexible substrate 20 are electrically connected to each other. Similarly, low frequency lines, power supply lines, and ground lines of the rigid substrate 10 and the flexible substrate 20 are also electrically connected to each other.

The spring (coil spring) 55 performing as a biasing unit is provided between the crimping block 50 and the pedestal block 30, and biases them in directions (vertical direction) in which the crimping block 50 and the pedestal block 30 are separated from each other. That is, the spring 55 biases the pedestal block 30 downward (toward the flexible substrate 20) with respect to the crimping block 50.

The attachment mechanism 60 is a well-known mechanism that supports the rigid substrate 10 and that attaches the inspection jig 1 to an inspection device (not illustrated). A detailed description thereof is omitted here. The attachment mechanism 60 is located above the contactor 40.

Figure 3:
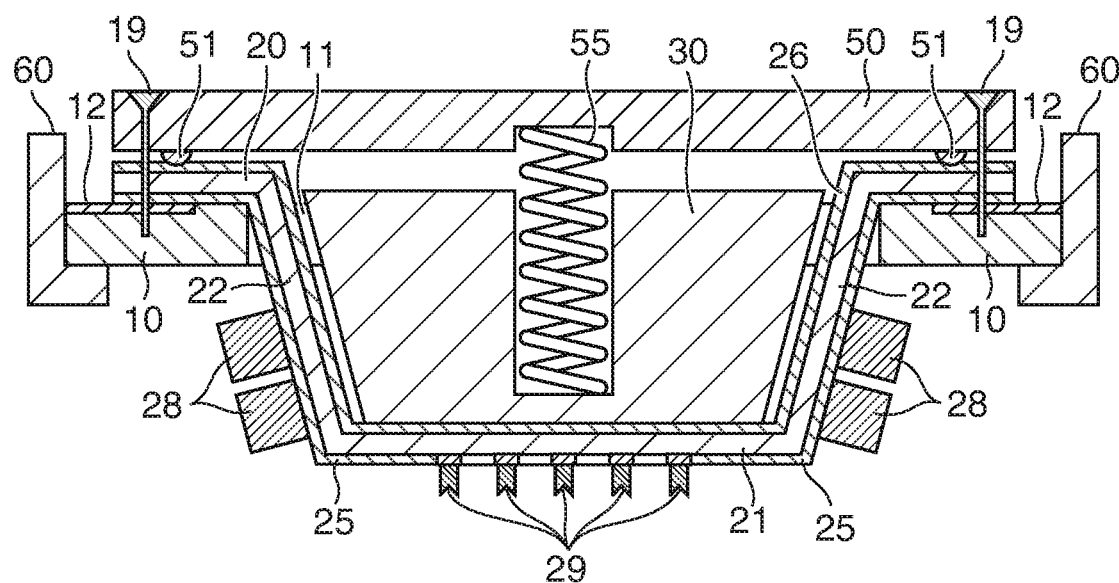
FIG. 3 is a schematic sectional view of an inspection jig according to a comparative example.

FIG. 3 is a schematic sectional view of an inspection jig according to a comparative example. The inspection jig according to the comparative example does not include the contactor 40 in the embodiment which is separated from the flexible substrate 20. The inspection jig according to the comparative example includes contact bumps 29 formed directly by an electroforming technique in the lower surface of the protruding portion 21 of the flexible substrate 20, and the contact bumps 29 contact bumps of a to-be measured wafer. In this configuration, loads are applied to the contact bumps 29 since the contact bumps 29 repeat a large number of times of contact, so that the contact bumps 29 are likely to be broken down by abrasion or the like. The entire flexible substrate 20 has to be replaced even when one contact bump 29 is broken down since the contact bump 29 cannot be formed again.

According to the present embodiment, the contact pads 23 of the flexible substrate 20 are electrically connected via the contactor 40 instead of being in direct contact with the bumps 91 of the to-be-measured wafer 90. Accordingly, the contact pads 23 are always in contact with the upper ends of the probes 42 and do not have to be brought into and out of contact with the bumps 91, and breakdown of the contact pads 23 is suppressed. This is a great advantage since the entire flexible substrate 20 has to be replaced even when one contact pad 23 is broken down. Here, even when the probes 42 are broken down, it is possible to repair the breakdown of the probes 42 by replacing the broken probes 42 only or replacing the contactor 40. Accordingly, time and the costs for replacement of the probes 42 can be suppressed since the flexible substrate 20 does not have to be replaced. That is, down time during mass production and costs required for repairing can be suppressed.

The present invention is described with reference to the embodiment. However, it is obvious to those skilled in the art that various modifications may be made to constituent elements and processes in the embodiment within the scope of the claims. Hereinafter, a modification is described.

The spring 55 is not limited to one spring that presses a center of a lower surface of the pedestal block 30, and may include a plurality of springs that press the lower surface of the pedestal block 30 except the center thereof.

According to the present invention, it is possible to provide an inspection jig capable of suppressing breakdown of contact portions of a flexible substrate.

What is claimed is:

1. An inspection jig comprising: a rigid substrate; a flexible substrate connected to the rigid substrate; a support supporting a part of the flexible substrate in a state that the part of the flexible substrate is protruded with respect to the rigid substrate in a first direction; a biasing unit configured to bias the support in the first direction with respect to the rigid substrate; and a contactor provided on a protruding portion of the flexible substrate, the protruding portion being protruded with respect to the rigid substrate, wherein the contactor includes: a contact housing; and a probe supported on the contact housing, one end of the probe being in contact with a contact portion on the protruding portion; wherein the contact housing is fixed to the support in a detachable manner and wherein the contact housing includes an insulating resin molded body.

2. The inspection jig according to claim 1, wherein the probe is provided in the contact housing in an individually replaceable state.

3. The inspection jig according to claim 1, wherein the support includes a recess, and the biasing unit is configured to enter into the recess.

4. The inspection jig according to claim 1, wherein the flexible substrate includes an inclined portion between both end portions and the protruding portion thereof, and
wherein at least one electronic component provided on the flexible substrate is disposed on the inclined portion.

5. The inspection jig according to claim 1, wherein the rigid substrate includes at least one through hole, through which the support extends in the first direction.

6. The inspection jig according to claim 5, wherein the flexible substrate extends at the other side in the first direction with respect to the rigid substrate, through the through hole.

7. The inspection jig according to claim 1, wherein the rigid substrate includes a material that is less deformable than the flexible substrate.

8. The inspection jig according to claim 1, wherein the rigid substrate includes a glass epoxy substrate.

9. The inspection jig according to claim 1, further comprising:
a crimping block that is fixed to the rigid substrate and sandwiches two end portions of the flexible substrate between the crimping block and the rigid substrate.

10. The inspection jig according to claim 9, wherein the crimping block includes elastic bodies that are configured to press both end portions of the flexible substrate to a surface of the rigid substrate in a direction opposite to the first direction in an elastic manner.

11. The inspection jig according to claim 9, wherein the support is biased in the first direction with respect to the crimping block by the biasing unit.

12. The inspection jig according to claim 11, wherein the support includes a substantially trapezoidal cross section.

13. The inspection jig according to claim 1, wherein the protruding portion of the flexible substrate includes a surface facing to the other side in the first direction, and the surface of the protruding portion is provided with a plurality of contact pads.

14. The inspection jig according to claim 13, wherein the surface of the protruding portion is a flat surface on which the contact pads serve as contact portions.

15. The inspection jig according to claim 13, wherein the flexible substrate includes a plurality of conductive patterns formed on the flexible substrate, the plurality of conductive patterns being connected to the contact pads.

16. The inspection jig according to claim 1, wherein the support includes an insulating resin molded body.

17. The inspection jig according to claim 1, wherein the support is in contact with the protruding portion.

18. The inspection jig according to claim 1, wherein the one end of probe is in elastic contact with the contact portion on the protruding portion.

* * * * *